United States Patent [19]

Werrbach

[11] Patent Number: 4,939,471
[45] Date of Patent: Jul. 3, 1990

[54] IMPULSE DETECTION CIRCUIT

[75] Inventor: Donn R. Werrbach, Los Angeles, Calif.

[73] Assignee: Aphex Systems Ltd., Sun Valley, Calif.

[21] Appl. No.: 347,827

[22] Filed: May 5, 1989

[51] Int. Cl.$^5$ ............................................. H03K 5/153
[52] U.S. Cl. .................................... 328/108; 307/350; 307/351; 307/358; 328/114; 328/117
[58] Field of Search ............... 307/350, 351, 354, 358; 328/114, 116, 117, 108

[56] References Cited

U.S. PATENT DOCUMENTS

| | | | |
|---|---|---|---|
| 4,358,738 | 11/1982 | Kahn | 307/358 |
| 4,362,996 | 11/1982 | Priebe | 307/358 |
| 4,468,625 | 8/1984 | Tandart et al. | 307/358 |
| 4,507,578 | 3/1985 | Matsuda | 307/358 |
| 4,507,795 | 3/1985 | Wagner | 307/358 |
| 4,637,003 | 1/1987 | Yokogawa | 307/351 |

Primary Examiner—John Zazworsky
Attorney, Agent, or Firm—Edward A. Sokolski

[57] ABSTRACT

An impulse detection circuit for use in triggering circuits such as those used for detecting drum beats within background noise and then triggering music synthesizers in response to the drum beat. Differentiators and peak-rectifiers and filters are used to detect impulse like inputs over a wide dynamic range in a noisy background. The input signal is rectified and differentiated and then inputted into a peak-rectifier and filter having a fast charging and a slow discharging time constant. The output of this peak-rectifier and filter is differentiated and inputted into a pair-rectifier and filters operating in parallel, which filters have rapid charging and slow discharging time constants. The time constants of one of the two filters are approximately twice those of the other. The outputs of the two peak-rectifier and filters are compared in a comparator. Because of the differences in the time constants of the two filters, the comparator produces a pulse output in response to each impulse that is input to the circuit of the invention.

7 Claims, 5 Drawing Sheets

IMPULSE DETECTION CIRCUIT

BACKGROUND OF THE INVENTION

1. Field of the Invention

This invention pertains to the electronic generation of music. More particularly this invention pertains to "triggering" devices for use with one or more electronic synthesizers. For instance "drum triggers" are used to control or "trigger" electronic synthesizers to produce drum-like sounds that have been stored in the digital memory of the synthesizer. The input of the "drum trigger" is typically obtained from an electrical transducer attached to either a standard drum or drum pad. The live drummer strikes the drum or drum pad which causes the "drum trigger," in turn, to output a pulse or trigger which causes the electronic synthesizer to produce the desired drum sound.

2. Description of the Prior Art

Typically, a prior art "drum trigger" uses a peak amplitude threshold comparator for comparing the signal obtained from the drum or drum pad to a reference threshold. The reference threshold is adjusted by the drummer so that the "drum trigger" operates in response to the drummer's striking of the drum or drum pad with a drum stick. In such a simple peak amplitude threshold comparator the threshold must be set at a relatively high level so that the drum trigger is not triggered by background sounds such as cross talk between drums or by the "ringing" of the drums. As a consequence this technique suffers from a lack of satisfactory operation over a wide dynamic range of drum strokes. The prior art device also typically exhibits only a limited ability to respond accurately to rapid drumming patterns.

SUMMARY OF THE INVENTION

The present invention is a device which receives its input from the transducer on the drum or drum pad and outputs a pulse to "trigger" the output of sound from the synthesizer. The present invention uses differentiators in combination with a peak-rectifier and filter and a parallel combination of a pair of peak-rectifier and filters with slightly different time constants in conjunction with a comparator to produce an output pulse in response to a wide dynamic range of inputs corresponding to the signals received from the drum or drum pad. Although the primary application of the present invention is the triggering of a synthesizer, it should be understood that the invention may be used in more general applications for the detection of impulses in noisy signals.

DETAILED DESCRIPTION OF THE INVENTION

Figure 1:
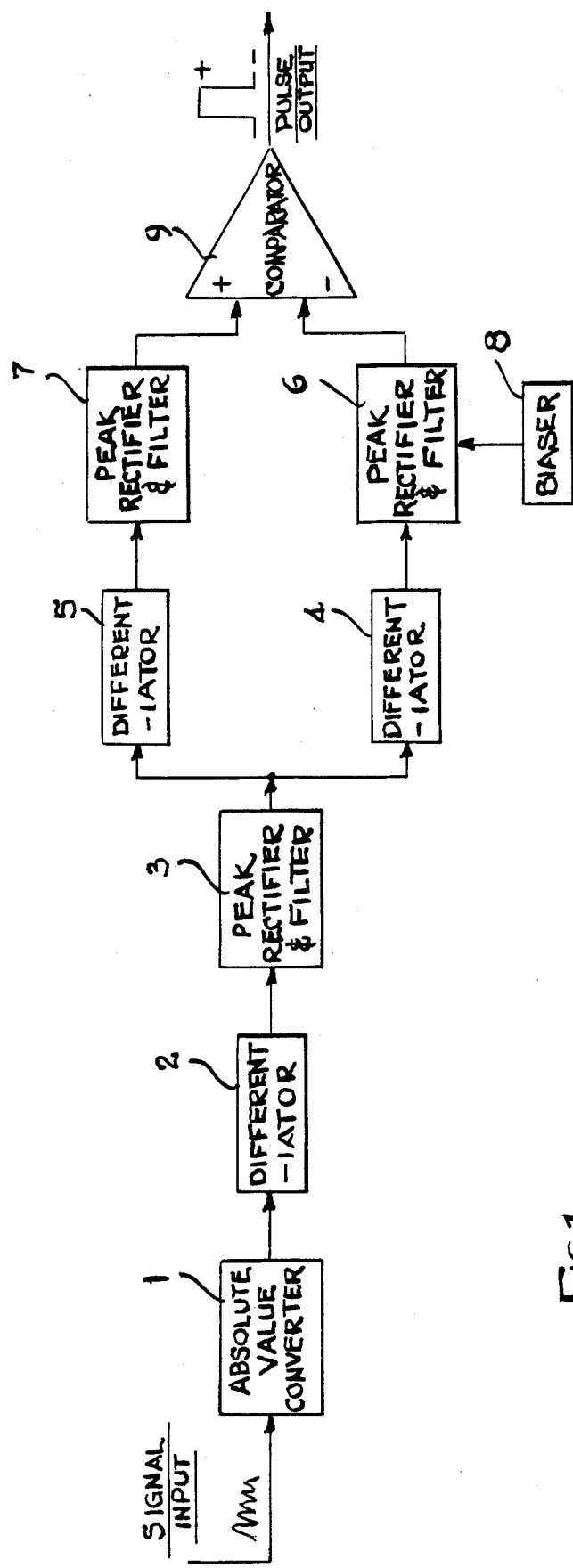
FIG. 1 is a block diagram of a preferred embodiment of the invention.

Referring now to FIG. 1. The input signal to the invention is the signal that is output from a transducer attached either to a drum or to a drum pad. This signal is input to the absolute value converter 1 depicted in FIG. 1. The absolute value converter 1 rectifies the input signal and then outputs this rectified signal to the differentiator 2. Differentiator 2 then generates an output signal which is approximately proportional to the time rate of change of the rectified signal. The output of differentiator 2 is then input to peak-rectifier and filter 3 which, in turn, peak-rectifies and filters the signal applied to its input. The output of peak-rectifier and filter 3 is input to the inputs of differentiator 4 and differentiator 5 which, in turn, output signals approximately proportional to the time rate of change of the input to these differentiators. The outputs from differentiators 4 and 5 are input respectively to peak-rectifier and filters 6 and 7 whose outputs are compared in comparator 9 to produce a pre-selected voltage as the output from comparator 9 during the period that the voltage output from peak-rectifier and filter 7 exceeds the voltage output by peak-rectifier and filter 6.

In the preferred embodiment the output from peak-rectifier and filter 6 further includes a bias voltage provided by biaser 8. In many applications, the biaser 8 is not necessary for the detection of impulses in noise. However, when the invention is used as a drum trigger, the addition of a bias from biaser 8 establishes a determined state for comparator 9 in the absence of an input signal so that triggering pulses are not output during periods of no input signal. The addition of the bias also avoids "double-triggering" that otherwise may occur under some operational circumstances. It should be understood that biaser 8 could instead be connected to peak-rectifier and filter 7 if the sign of the bias were reversed.

Figure 5:
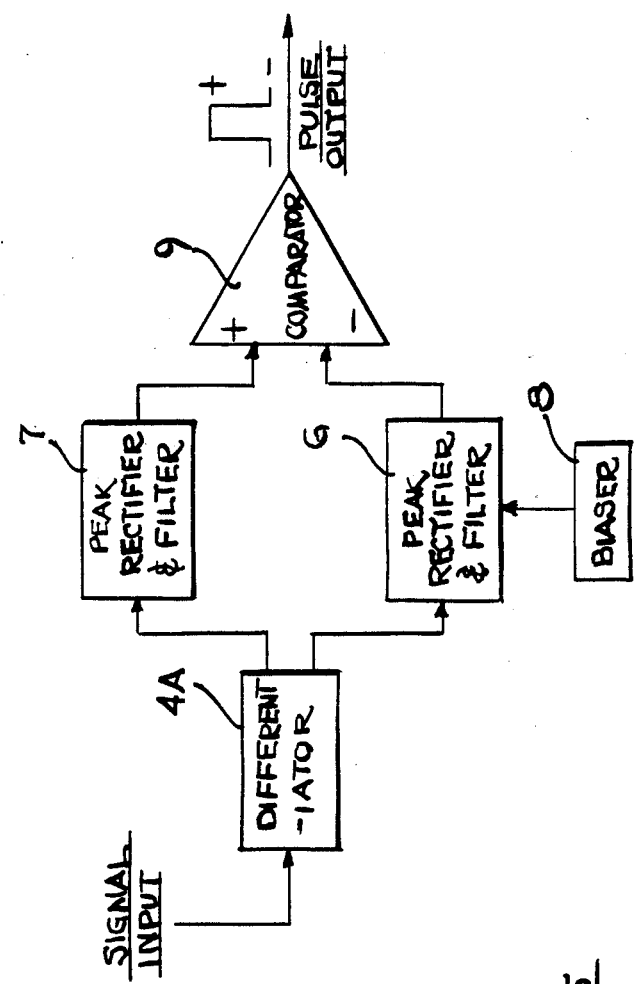
FIG. 5 is a block digram of an embodiment of the invention using a single differentiator.

Although the preferred embodiment includes differentiator 4 and 5, as depicted in FIG. 5 a single differentiator could be used in their place with the output of the single differentiator being connected to both of the inputs to peak-rectifier and filters 6 and 7. Absolute value converter 1, as well as differentiator 2 and peak-rectifier and filter 3 also may also be omitted and the input signal from the drum transducer fed directly into the inputs of differentiator 4 and 5. However, the operation of the invention is improved by the addition of these elements.

Figure 2:
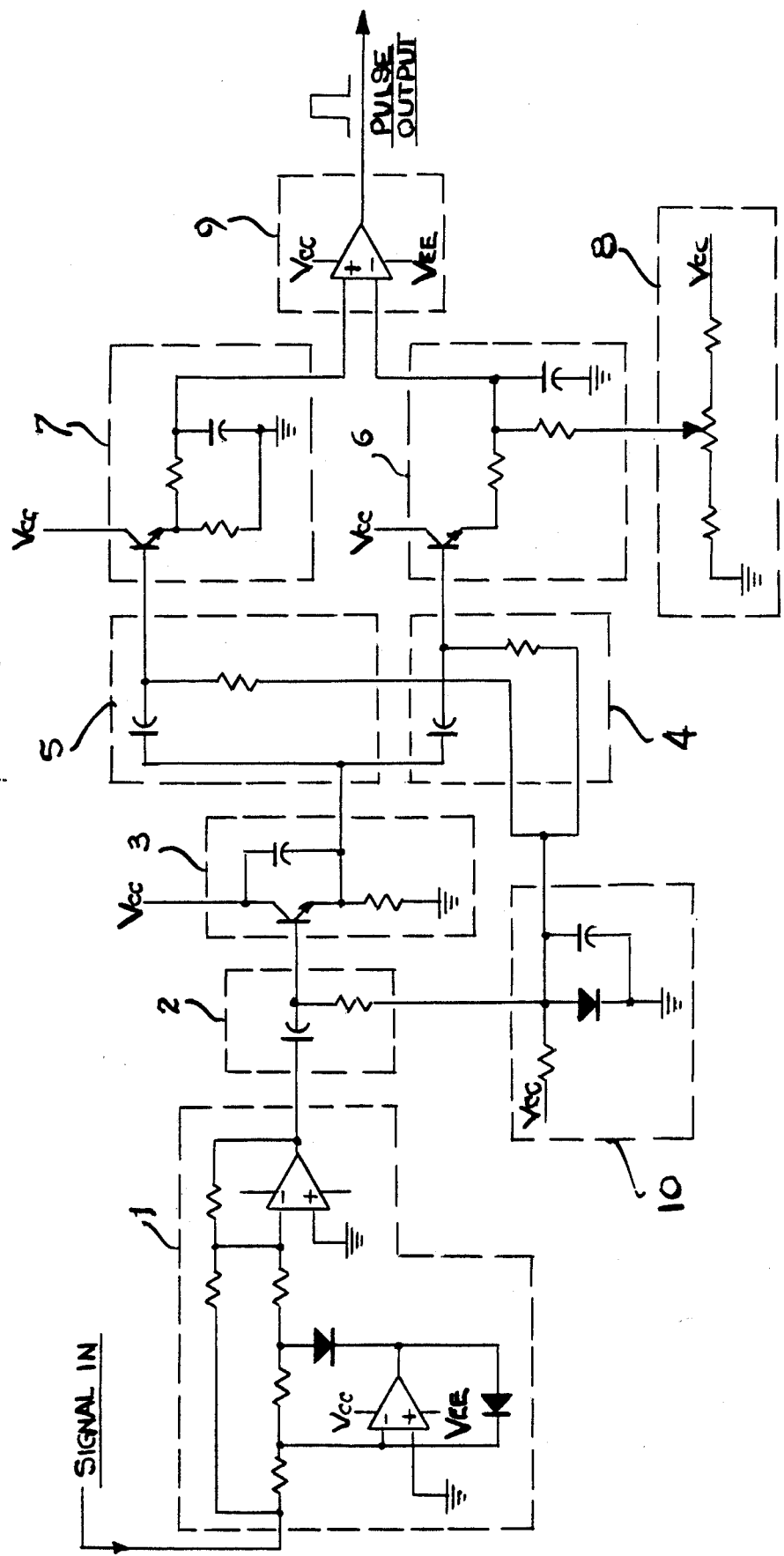
FIG. 2 is a schematic diagram of a preferred embodiment of the invention.

The circuitry in the preferred embodiment for performing the functions depicted in FIG. 1 is shown in FIG. 2. In FIG. 2, the combination of circuit elements which together perform each of the functional operations depicted in FIG. 1 are enclosed in dashed line boxes that are numbered in accord with the functions depicted in FIG. 1. For instance, in FIG. 2, the circuit elements depicted within dashed line box 1 cooperate to produce an output which represents the absolute value or rectified value of the signal that is input to the invention. The resistor and capacitor depicted within dashed line box 2 in FIG. 2 operate as a differentiator so as to produce an output approximately equal to the time rate of change of the input to these elements. The time constant of the resistor-capacitor combination in dashed line box 2 in the preferred embodiment is approximately 1 millisecond.

Figure 4:
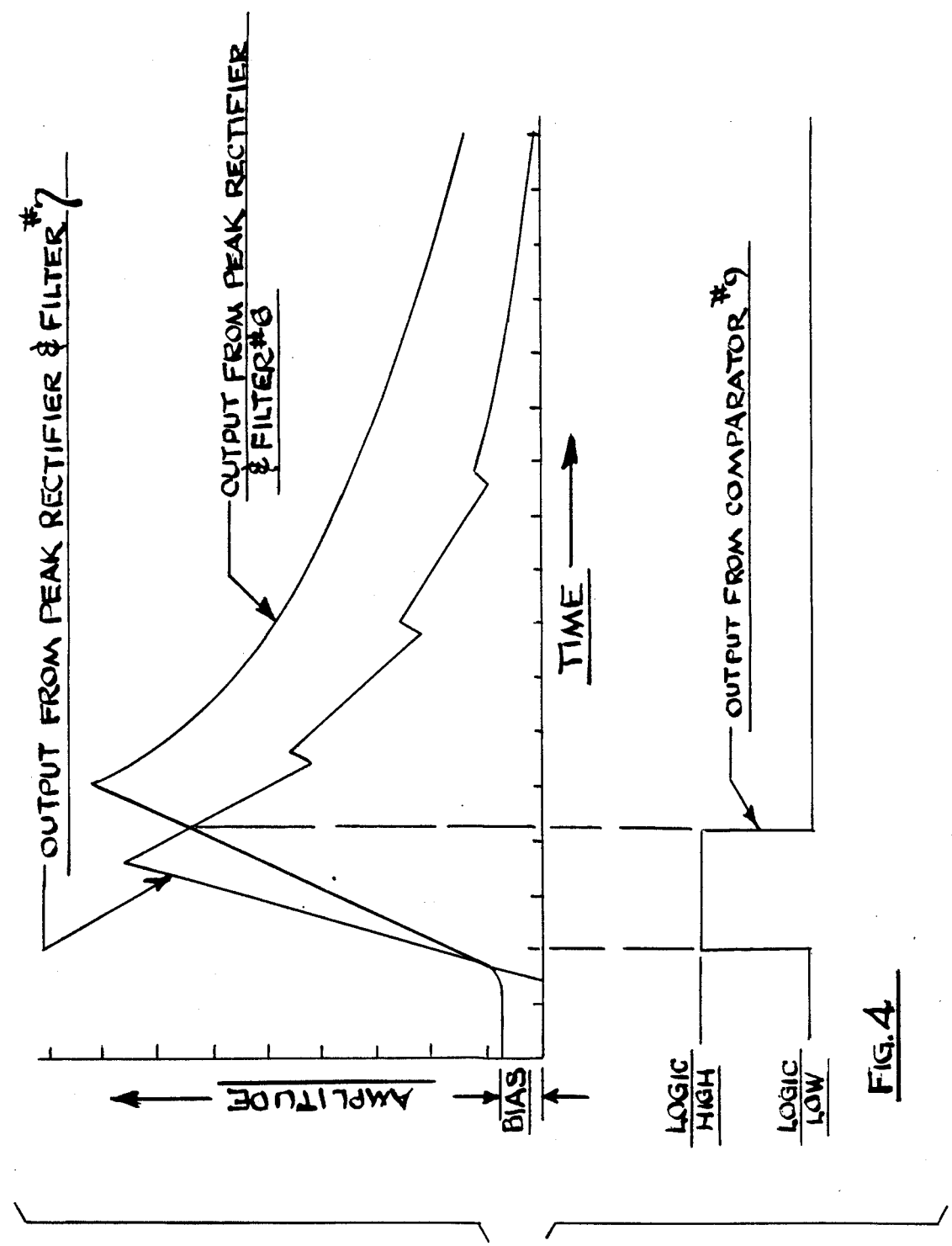
FIG. 4 depicts typical outputs of the two peak-rectifier and filter circuits that are inputted into the comparator.

The transistor, resistor and capacitor depicted in dashed line box 3 of FIG. 2 together operate as a peak-rectifier and filter that rapidly charges the capacitor to the peak value of the input voltage to the transistor and then discharges the capacity more slowly, all relative to the steady state conditions for the capacitor. At steady state with no signal input, the capacitor remains charged at a value nearly equal to the collector voltage $V_{cc}$. In reality the capacitor is discharged by the input signal; however, in terms of dynamic changes, the capacitor can be considered to be rapidly charged to the peak input value of the input voltage and then discharged slowly thereafter. In the preferred embodiment the charging time constant is somewhat less than 1 microsecond and the discharge time constant is approximately 15 milliseconds. The output from peak-rectifier and filter 3 is input to differentiators 4 and 5. The differentiation is provided by the resistors and capacitors depicted in dashed line box 4 and in dashed line box 5 in FIG. 2. The resistor-capacitor combinations have a time constant of approximately 4.4 milliseconds. The outputs from differentiators 4 and 5 are input to the transistor, resistor and capacitor combinations depicted in peak-rectifier and filter 6 and in peak-rectifier and filter 7 of FIG. 2. The peak-rectifier and filter 6 has a charging time constant of approximately 100 microseconds and a discharge time constant of approximately 50 milliseconds. The peak-rectifier and filter 7 has a shorter charging time constant of approximately 50 microseconds and a discharge time constant of approximately 25 milliseconds. As a consequence of the different time constants in peak-rectifier and filters 6 and 7, the output from peak-rectifier and filter 6 is delayed in time relative to the output from peak-rectifier and filter 7. These outputs and their temporal relationship are depicted in FIG. 4.

The outputs of peak- rectifer and filters 6 and 7 are input to comparator 9, which comparator produces a pre-selected output voltage representing a logic "on" during the period of time that the output from peak-rectifier and filter 7 exceeds the output from peak-rectifier and filter 6. The output pulse may then be used to trigger the production of a drum-like sound by the synthesizer. It is the output from peak-rectifier and filter 6 which has a slower charging time and a slower (i.e. longer) discharge time than that of peak-rectifier filter 7 that effectively operates as a dynamic, continually changing threshold for the detection of impulses in the input signal.

Figure 3:
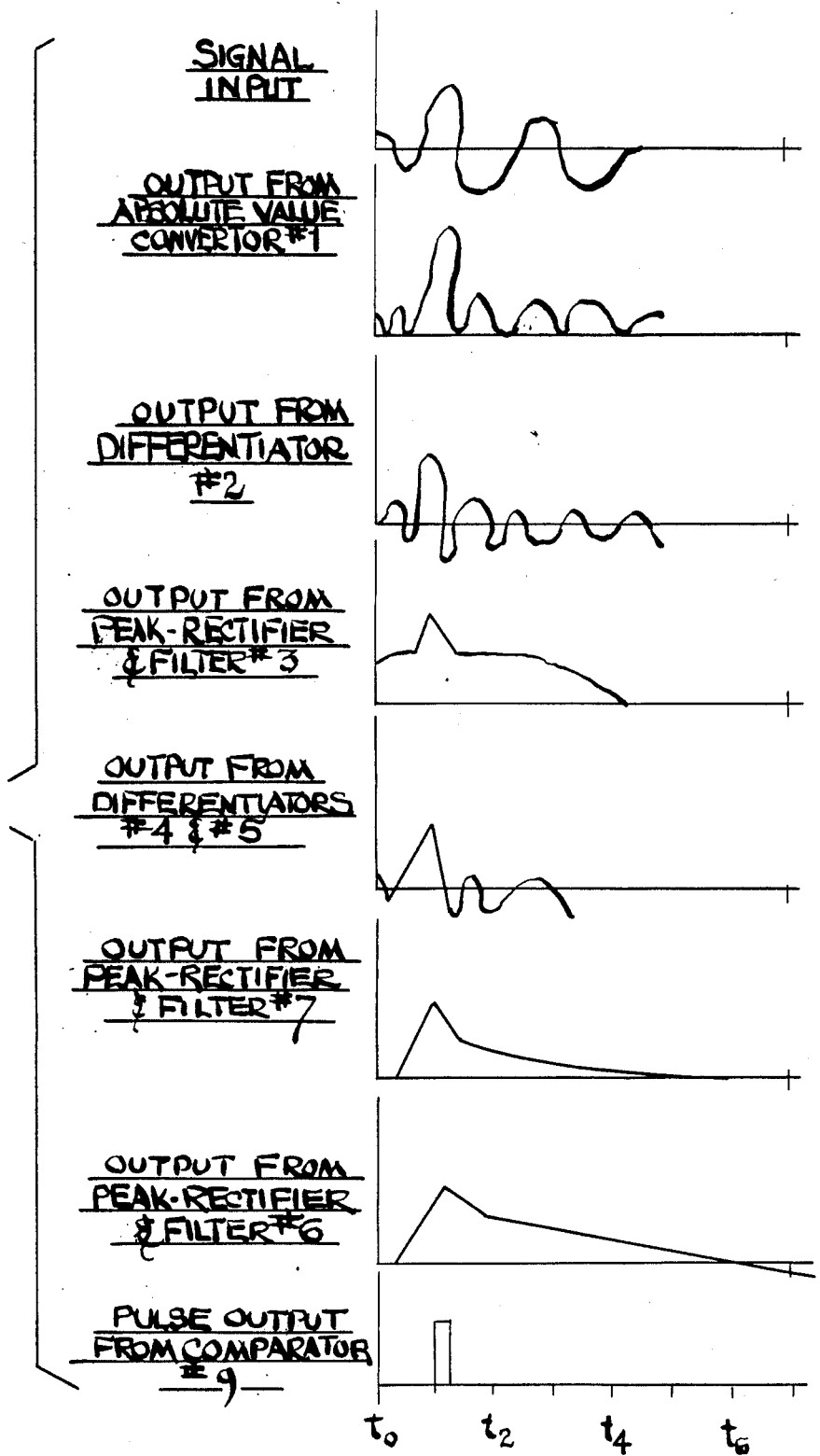
FIG. 3 depicts the form of a typical signal which appears at various points in the circuit of the invention.

The resistor, diode and capacitor depicted in dashed line box 10 in FIG. 2 provide biasing for the transistors utilized in the invention. FIG. 3 depicts the typical signals as a function of time as they appear at various points in the circuitry of the invention. The points in the circuitry at which the various signals appear are indicated by the labels in FIG. 3.

I claim:

1. A device for the detection of impulses in an electrical signal comprising:
   a differentiator having an input and an output, the differentiator receiving the electrical signal at its input and generating at its output a differentiated signal approximating the time rate of change of the electrical signal,
   a first peak-rectifier and filter having an input and an output, the first peak-rectifier and filter receiving at its input the differentiated signal output by the differentiator, the first peak-rectifier and filter operating to peak-rectify and filter the signal at its input to generate at its output a first peak-rectified and filtered signal,
   a second peak-rectifier and filter having an input and an output, the second peak-rectifier and filter also receiving at its input the differentiated signal output by the differentiator, the second peak-rectifier and filter operating to peak-rectify and filter the signal at its input to generate at its output a second peak-rectified and filtered signal,
   the first peak-rectifier and filter having a first set of filter time constants, and the second peak-rectifier and filter having a second set of filter time constants, the first set of filter time constants differing from the second set of filter time constants, and
   a comparator having a first input and a second input and an output, the comparator receiving at its first input the first peak-rectified and filtered signal and receiving at its second input the second peak-rectified and filtered signal, the comparator outputting a pre-selected signal whenever the first peak-rectified and filtered signal is greater than the second peak-rectified and filtered signal.

2. A device for the detection of impulses in an electrical signal comprising:
   a first differentiator having an input and an output, the first differentiator receiving the electrical signal at its input and generating at its output a first differentiated signal approximating the time rate of change of the electrical signal,
   a first peak-rectifier and filter having an input and an output, the first peak-rectifier and filter receiving at its input the first differentiated signal output by the first differentiator, the first-peak rectifier and filter operating to peak-rectify and filter the signal at its input to generate at its output a first peak-rectified and filtered signal,
   a second differentiator having an input and an output, the second differentiator also receiving the electrical signal at its input and generating at its output a second differentiated signal approximating the time rate of change of the electrical signal,
   a second peak-rectifier and filter having an input and an output, the second-peak rectifier and filter receiving at its input the second differentiated signal output by the second differentiator, the second-peak rectifier and filter operating to peak-rectify and filter the signal at its input to generate at its output a second peak-rectified and filtered signal,
   the first peak-rectifier and filter having a first set of filter time constants, and the second peak-rectifier and filter having a second set of filter time constants, the first set of filter time constants differing from the second set of filter time constants, and
   a comparator having a first input and a second input and an output, the comparator receiving at its first input the first peak-rectified and filtered signal and receiving at its second input the second peak-rectified and filtered signal, the comparator outputting a pre-selected signal whenever the first peak-rectified and filtered signal is greater than the second peak-rectified and filtered signal.

3. The device described in claim 1 and further comprising:
   a third differentiator having an input and an output, the third differentiator receiving the electrical signal at its input and generating at its output a third differentiated signal approximating the time rate of change of the electrical signal, a third peak-rectifier and filter having an input and an output, the third peak-rectifier and filter receiving at its input the third differentiated signal output by the third differentiator, the third peak-rectifier and filter operating to peak-rectify and filter the signal at its input to generate at its output a third peak-rectified and filtered signal, the output of the third peak-rectifier and filter being connected to and providing the signals input to the differentiator recited in claim 1.

4. The device described in claim 2 and further comprising:

a third differentiator having an input and an output, the third differentiator receiving the electrical signal at its input and generating at its output a third differentiated signal approximating the time rate of change of the electrical signal, a third peak-rectifier and filter having an input and an output, the third peak-rectifier and filter receiving at its input the third differentiated signal output by the third differentiator, the third peak-rectifier and filter operating to peak-rectify and filter the signal at its input to generate at its output a third peak-rectified and filtered signal, the output of the third peak-rectifier and filter being connected to and providing the signals input to the first and second differentiators recited in claim 2.

5. The device described in claim 3 and further comprising:

an absolute value converter having an input and an output, the absolute value converter receiving the electrical signal at its input and generating at its output a signal approximating the absolute value of the electrical signal, the output of the absolute value converter being connected to the input of the third differentiator recited in claim 3.

6. The device described in claim 4 and further comprising:

an absolute value converter having an input and an output, the absolute value converter receiving the electrical signal at its input and generating at its output a signal approximating the absolute value of the electrical signal, the output of the absolute value converter being connected to the input of the third differentiator recited in claim 4.

7. The device described in any one of claims 1–6 and further comprising:

a biaser connected to one of said first or second peak-rectifier and filters, the biaser adding a pre-selected bias to the signal output by said first or second peak-rectifier and filter.

* * * * *